(12) United States Patent
Naujokat

(10) Patent No.: US 8,826,059 B2
(45) Date of Patent: Sep. 2, 2014

(54) APPARATUS AND METHOD FOR BUFFERING DATA BETWEEN MEMORY CONTROLLER AND DRAM

(75) Inventor: Joern Naujokat, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 1248 days.

(21) Appl. No.: 12/686,897

(22) Filed: Jan. 13, 2010

(65) Prior Publication Data

US 2010/0211728 A1 Aug. 19, 2010

(30) Foreign Application Priority Data

Jan. 14, 2009 (DE) .......................... 10 2009 004 565

(51) Int. Cl.
| | | |
|---|---|---|
| G06F 1/00 | (2006.01) | |
| G06F 1/04 | (2006.01) | |
| G11C 29/02 | (2006.01) | |
| G11C 7/22 | (2006.01) | |
| G11C 7/04 | (2006.01) | |

(52) U.S. Cl.
CPC *G11C 7/22* (2013.01); *G11C 29/02* (2013.01); *G11C 7/222* (2013.01); *G11C 2207/2254* (2013.01); *G11C 29/028* (2013.01); *G11C 29/023* (2013.01); *G11C 7/04* (2013.01)
USPC ............ 713/401; 713/400; 713/500; 713/503

(58) Field of Classification Search
CPC ......... G06F 1/04; G06F 1/08; H04L 12/2697; G01R 31/31725; G01R 31/31727
USPC .................................. 713/400, 401, 500, 503
See application file for complete search history.

(56) References Cited

U.S. PATENT DOCUMENTS

| | | | | |
|---|---|---|---|---|
| 5,128,625 | A * | 7/1992 | Yatsuzuka et al. ............ | 327/156 |
| 7,222,036 | B1 * | 5/2007 | Thorne ........................... | 702/79 |
| 7,421,525 | B2 * | 9/2008 | Polzin et al. .................. | 710/100 |
| 7,571,396 | B2 * | 8/2009 | Hughes et al. ................ | 716/100 |
| 7,627,730 | B1 * | 12/2009 | Moll ............................. | 711/170 |
| 7,818,528 | B2 * | 10/2010 | Hughes ......................... | 711/167 |
| 8,024,694 | B2 * | 9/2011 | Jamann et al. ................ | 716/132 |
| 2008/0080647 | A1 | 4/2008 | Altmann et al. | |
| 2008/0244476 | A1 * | 10/2008 | Fotakis et al. ..................... | 716/4 |
| 2008/0256282 | A1 | 10/2008 | Guo et al. | |

* cited by examiner

*Primary Examiner* — Mark Connolly
(74) *Attorney, Agent, or Firm* — Alan A. R. Cooper; Frederick J. Telecky, Jr.

(57) ABSTRACT

A apparatus is provided for buffering data between a memory controller and a DRAM. The apparatus includes a phase locked loop (PLL), a phase interpolator for aligning a phase of an output clock signal in response to a phase aligning control word, and a non-volatile storage location permanently storing the phase aligning control word. The phase aligning control word is determined through an initial training procedure of the device under predetermined training conditions of at least a supply voltage level and a temperature, and the predetermined training conditions are set so as to optimize the phase alignment of an edge of the output clock signal with respect to the buffered data signal.

4 Claims, 8 Drawing Sheets

APPARATUS AND METHOD FOR BUFFERING DATA BETWEEN MEMORY CONTROLLER AND DRAM

CROSS-REFERENCE TO RELATED APPLICATIONS

This application is claims priority from German Patent Application No. 10 2009 004 565.1, filed Jan. 14, 2009, which is hereby incorporated by reference for all purposes.

FIELD OF THE INVENTION

The invention relates to an apparatus and a method for buffering data between a memory controller and Dynamic Random Access Memory (DRAM).

BACKGROUND

Registered buffers are used in a number of conventional circuits. Registered buffers as for example used in Double Data Rate 3 (DDR3) memory systems buffer incoming data (control data and address information) and output the received data with a refreshed waveform. These registered buffers include a phase locked loop (PLL) and a phase interpolator for phase aligning the output clock with respect to the refreshed data.

Referring to FIG. 1, a DDR3 system 100 is shown. Here, a memory controller 102 provides address information and clock signals to dual inline memory modules (DIMMs) 104-1 to 104-n. DIMM 104-1 is shown in more detail. DIMM 104-1 includes a registered buffer 106 receiving address information at data input Dn and clock signals at clock input CLK. The registered buffer 106 refreshes and phase aligns the data and transmit it to several sychronous DRAM (SDRAM) modules 108-1 to 108-m through data output Qn using clock signal QCLK. Data from and to the SDRAM modules 108-1 to 108-m is transferred through a data bus coupled between data pins Data-1 to Data-m, strobe signals Strobe-1 to Strobe-m, and SDRAM modules 108-1 to 108-2. Registered buffer 106 uses a feedback loop between pins FBOUT and FBIN for its internal PLL in order to adapt, for example to different load conditions and ambient conditions such as temperature. The data signals Dn (and Qn) include the memory system addresses and command/control signals from the memory controller 102. Generally, registered buffer 106 serves to improve data waveforms and phase alignment of data and clock signals and to reduce clock jitter. Registered buffer 106 should provide a good data eye opening and small propagation delay of the data from the device inputs to the device outputs. A sufficient data eye opening at the data output pins is required in order to generally ensure a safe and successful data transfer to the receiving DRAM devices (such as SDRAM modules 108-1 to 108-m). A small propagation delay supports an overall low system latency, i.e. a short time for writing data into and reading data form the SDRAM modules 108-1 to 108-m.

Turning to FIG. 2, a simplified block diagram of registered buffer 106 with a PLL clock driver can be seen. The registered buffer 106 shown in FIG. 2 generally comprises input stages (input buffers B1 to B3) for input data signals Dn, input clock signal CK and feedback input clock signal FBIN, output stages (output buffers B4 to B7) for output data signals Qn, output clock signals Yn and feedback output clock signal FBOUT. There is also a data register that generally comprises several flip-flops FF1, a data reference path with a dummy output stage B5, a PLL 110, a phase aligning state machine PASM, a phase interpolator PINT, a delay element DLY, and a phase comparator PCOMP. Although there is only one data path PQn shown in FIG. 2, there are usually numerous similar data paths for a plurality of data signals Dn (IDn) of a bus. The PLL 110 receives the input clock CK as a reference clock ICK and the feedback input clock FBIN as PLL 110 feedback clock IFBIN. The PLL 110 generates the feedback output signal PFBOUT which is then output from as signal FBOUT after being buffered in output buffer B7. The PLL 110 is coupled to phase interpolator PINT and feeds a set of phase shifted output clock signals CK1 to CKn to phase interpolator PINT. Phase interpolator PINT generates output clock signal PYn, which is buffered in output stage B6 and output as the output clock Yn. The clock frequency FCK of all PLL output clock signals CK1 to CKn and the feedback output clock FBOUT is equal to the clock frequency of the input clock signal CLK. A clock period TCK refers to a clock frequency FCK.

The purpose of the PLL 110 is to generally provide output clock signals Yn with reduced input clock jitter, which are phase aligned (i.e. phase shifted) with respect to the input clock signal CLK. Data transfer from the data inputs Dn to the data outputs Qn is triggered by the input reference clock CK. Therefore, the propagation delay TPD (CK to Qn) from the clock input pin CK to the data output Qn consists of the propagation delay through the clock input stage B2, the data flip-flop FF1 and the data output stage B4. The propagation delay TPD (CK to Qn) depends on the electrical characteristics of the transistor devices of the dies or wavers (weak, nominal or strong process material). The phase relationship of the output clock Yn is individually trained for each registered buffer device during the power up procedure. During this training procedure, the phase of the output clock Yn is shifted such that a maximum output data eye opening is achieved. A maximum output data eye opening means that the rising edge of the output clock Yn is in the middle of an output data high or low pulse assuming that the data signal Dn/Qn has a signal frequency which is half the input clock frequency FCK.

Tuning to FIG. 3, the propagation delay for clocks CK (and CKN) data signals Dn and Qn, and output clock signals Yn and YnN, where the capital "N" indicates the inverted signal. Differential data and clock signals are also used. The propagation delay form clock edge of clock signal CK to changing data Qn is indicated as TPD (CK→Qn). The phase of clock signal PYn in the output clock path is compared with the phase of the data reference signal PRQn in the data reference path. The data signal PRQn is generated by a data reference path flip-flop FF2 toggling with the input clock frequency FCK. The frequency of reference data signal PRQn is half the frequency FCK of input clock signal CK. Clock signal PYn is also divided by two in order to receive the same clock frequency as PRQn. In order to compensate the time delay of this division by two (i.e., the delay of the respective circuitry), it is necessary to insert an equivalent time delay element DLY into the reference path for PRQn. The delayed signal PRQn and the divided signal PYn are fed to phase comparator PCOMP. The output of phase comparator PCOM is coupled to phase aligner state machine PASM, which determines whether the PYn phase needs to be shifted a certain amount forward or backward compared to the PRQn signal. In order to adapt the phase, a phase aligning control word PACW is generated in phase aligning state machine PASM and passed to phase interpolator PINT. Phase controller PACW selects the desired PLL phase for clock signal PYn. Signal PYn is buffered in buffer B6 and is output as the output clock signal Yn. The phase aligning state machine PASM not only monitors the phase relationship between reference data signals PRQn and clock signal PYn, but also surveys the phase relationship between clock signal ICK and clock signal IFBIN (i.e., the phase relationship between the clock reference and the clock feedback inputs). Based on these comparison results, the phase aligning state machine PASM decides when the PLL 110 and the phase aligner phase alignment are locked and when the phase aligning training can be stopped. When the PLL and phase aligning are locked and the phase aligning training is completed, the phase aligning control word PACW remains fixed. The phase of the output clock Yn is then fixed. After having completed the PLL 110 power up and phase aligning training procedure, the registered buffer 106 returns to normal operation mode for a specific application. The phase of the output clock Yn is generally not be changed during normal operation as the memory controller 102 is trained with the fixed phase of Yn. The phase aligning training is only performed once during an initial power up procedure. It may also be performed in response to an external training trigger signal TPAT.

An important device parameter is TQsk. TQsk is the relationship between the output clock Yn and the output data Qn and can serve as an indicator for the quality of the data output eye. FIG. 4 shows waveforms illustrating the meaning of TQsk. TQsk describes the time (or phase) difference of the rising or falling edge of the output data signal Qn with respect to the falling edge of the output clock signal Yn. If the signal edges of Qn are very close to the falling edge of Yn, the corresponding rising edge of Yn is almost ideally centered in the middle of the output data signal Qn (e.g. high or low pulse). If the signal edge of Qn is outside the specified limits TQskmin or TQskmax, the rising edge of Yn is outside the desired ideal middle position in the output data pulse and Qn may not be decoded correctly in a DRAM receiving Qn.

A problem with prior art devices is that the initial training procedure for the clock phase alignment is performed at arbitrary conditions. If these conditions (for example, temperature and supply voltage level) vary for a specific clock frequency, the specified minimum or maximum values TQskmin, TQskmax for TQsk can be exceeded. This would require retraining of the registered buffer 106, which is not allowed since the memory controller 102 relies on the fixed phase of the output clock Yn during normal operation. Furthermore, it can be difficult to determine whether or not retraining is required. Transmission errors or total failure of the system can be the consequence.

SUMMARY

It is an object of the invention to provide an apparatus and a method for buffering data between a memory controller and a DRAM which satisfies phase alignment requirements for buffered clock and data signals for varying ambient conditions and parameters.

Accordingly, an apparatus for buffering a data signal between a memory controller and a DRAM is provided. The apparatus comprises a phase locked loop (PLL), a phase interpolator for aligning a phase of an output clock signal in response to a phase aligning control word, and a non-volatile storage location permanently storing the phase aligning control word. The phase aligning control word is determined through an initial training procedure of the apparatus at predetermined training conditions of at least a supply voltage level and a temperature. The predetermined training conditions are set so as to optimize the phase alignment of an edge of the output clock signal with respect to the buffered data signal. The training procedure is advantageously performed in an automatic test equipment (ATE) during a final stage of the manufacturing process. The training may advantageously be performed for each apparatus individually. The phase aligning control word is determined in an initial training procedure under predetermined conditions. The training conditions are set in a specific manner with respect to a range of admissible deviations from the optimum value for the phase relationship between clock edges and data edges.

Some advantages are that the data eye opening is improved without impairing the propagation delay of the data in the apparatus or the system latency and that the data eye opening can flexibly be shifted around a clock edge. Furthermore, the timing parameter can be individually stored in each apparatus and fits the requirements and characteristics of the specific apparatus (i.e. its type and its parameters within a production lot) and the applications.

The training conditions during the initial training may be set between at least two corners. Corners are combinations of maximum and minimum values for parameters and/or ambient conditions as for example temperature, supply voltage level, frequency and various design and process parameters. The temperature and supply voltage level may be important operating and training conditions.

The training conditions may be set in the middle of at least two corners of the conditions. This limits the maximum possible deviation from an optimal timing compared with the arbitrary training conditions of an initial procedure performed at the beginning of normal operation during a power up procedure.

In another embodiment, the training conditions during the initial training (e.g. in the automatic test equipment) may advantageously not be set in the middle of two corners. The training conditions may then be set closer to one corner than to another. This makes it possible to comply with an asymmetric behavior of the phase of the apparatus with respect to the training conditions. If, for example a change of a phase (or a change of timing) varies over the full admissible temperature range, it can be useful to perform the initial training procedure not in the middle between minimum and maximum temperature, but closer to the minimum or the maximum temperature. Furthermore, it can be useful to perform the initial training procedure not in the middle between minimum and maximum supply voltage level, but closer to the minimum or the maximum admissible supply voltage level (for a specific supply voltage). The training conditions may then be set asymmetrically with respect to the corners and a respective phase aligning control word can be stored. This can increase applicability of the device without violating the specified minimum maximum values for phase or delay parameters.

The corners can be, for example a combination of maximum supply voltage and minimum temperature or minimum supply voltage and maximum temperature.

The non-volatile memory in the apparatus may have a plurality of non-volatile storage locations for storing a plurality of phase aligning control words. After the initial training in an ATE, the non-volatile memory may contain a plurality of phase aligning control words for different operating clock frequencies (speed nodes) and/or supply voltage levels of the apparatus. This makes it possible to train the apparatus in advance for different operating clock frequencies and supply voltage levels. For each operating clock frequency and/or supply voltage level a phase aligning control word may be stored in a specific storage location of the non-volatile memory. These phase aligning control words can be retrieved from the non-volatile memory during normal operation in order to satisfy the requirements of various different applications.

The invention also provides a method of buffering data between a memory controller and a DRAM of an apparatus and aligning a phase of an output clock signal of the apparatus with respect to the data. During an initial training procedure, for example in an automatic test equipment, predetermined training conditions of at least a supply voltage and a temperature for the device are set. A training procedure is performed with the device. A phase aligning control word indicating the optimized phase alignment of the output clock signal under the predetermined conditions is determined. This phase aligning control word is permanently stored in a non-volatile memory in the apparatus. Later during normal operation, the apparatus is run with a phase relationship that is generated using the stored phase aligning control word.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION

Figure 1:
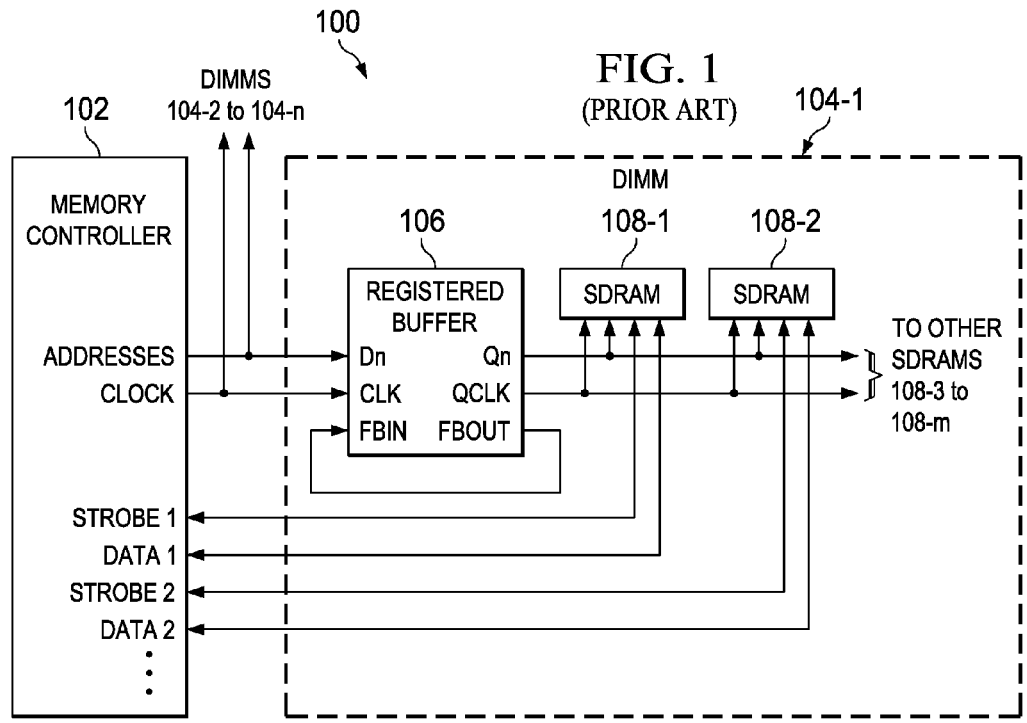
FIG. 1 shows a simplified block diagram of a conventional DDR3 memory system.

Refer now to the drawings wherein depicted elements are, for the sake of clarity, not necessarily shown to scale and wherein like or similar elements are designated by the same reference numeral through the several views.

Figure 2:
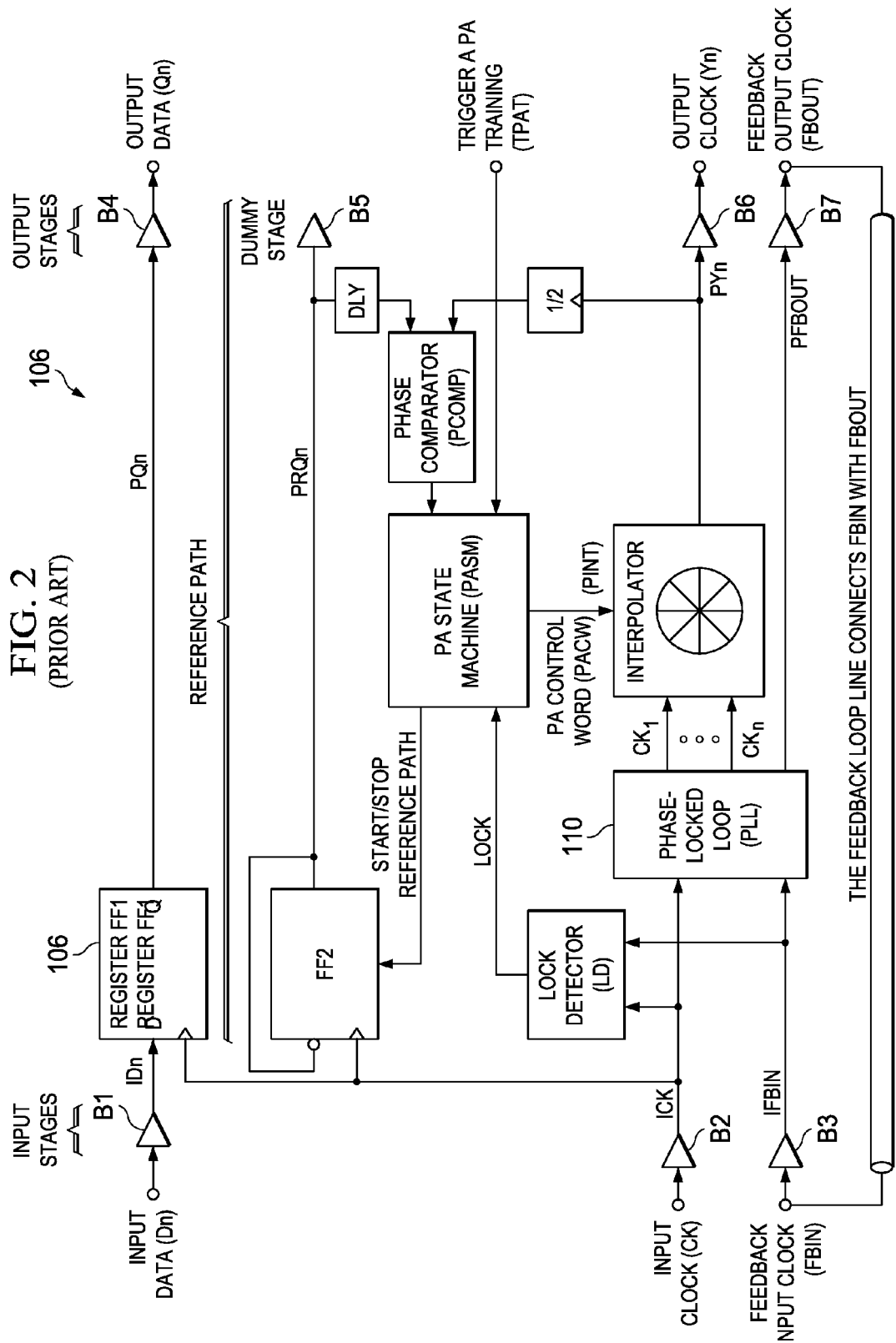
FIG. 2 shows a simplified block diagram of a conventional registered buffer of the memory system of FIG. 1.
Figure 3:
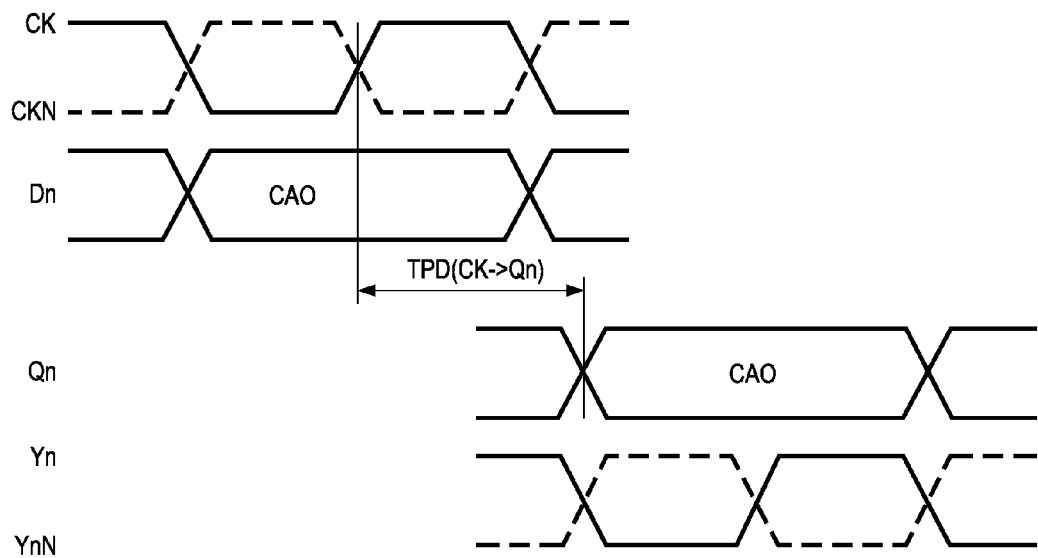
FIG. 3 shows waveforms illustrating propagation delay in the registered buffer of FIG. 2.
Figure 4:
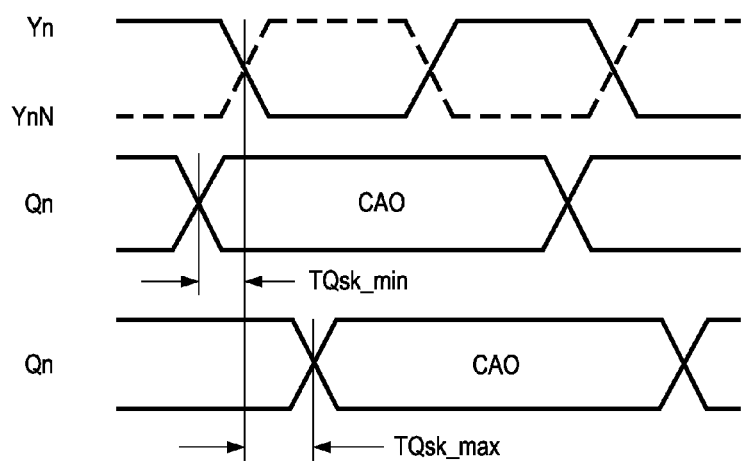
FIG. 4 shows waveforms illustrating the TQsk parameter.
Figure 5:
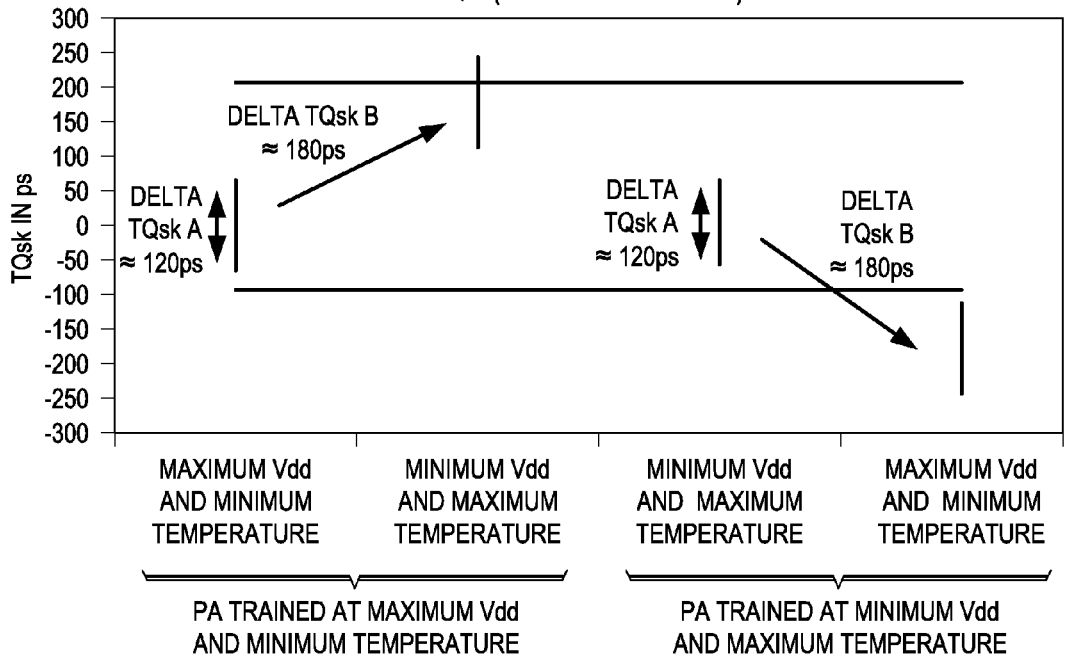
FIG. 5 shows timing parameter variations with respect to training and operating condition corners.

Turning to FIG. 5, it shows timing parameter variations and timing parameter ranges of the timing parameter TQsk in view of training and operating condition corners of the supply voltage Vdd and the operating temperature of a registered buffer R. FIG. 5 shows scenarios in which the apparatus (e.g., the registered buffer R shown in FIG. 1 and FIG. 2) is trained under training conditions of maximum or minimum supply voltage (max. Vdd, min Vdd.) and minimum or maximum temperature (min. temp., max. temp), respectively, and used at opposite corners. All four scenarios relate to the same, single and fixed clock frequency FCK of input clock CK. The two horizontal lines indicate the specification limits for parameter TQsk. The upper limit is at +200 ps and the lower limit is at −100 ps. From left to right four scenarios are shown.

In the first scenario the phase aligning training is performed at the maximum allowed supply voltage level Vdd (max. Vdd) and at minimum allowed temperature (min. temp.). The left vertical bar DeltaTQskA spans all measured TQsk values of a huge number of apparatuss (registered buffers R) and all relevant output pins. Bar DeltaTQskA is centered around 0 ps.

The second vertical bar from left to right relates to a scenario where the registered buffers 106 is trained under the same operating conditions for supply voltage and temperature as in the first scenario. However, after having trained and phase aligned the output clock Yn under these training conditions, the supply voltage is turned to minimum and the temperature is changed to maximum (the operating conditions are changed to another corner of minimum allowed supply voltage Vdd and maximum allowed environment temperature). Due to the change in supply voltage and temperature, the TQsk bar is shifted to higher (more positive) timing values (between about 120 ps and 240 ps). The amount of TQsk shift is indicated as DeltaTQskB. In this example, DeltaTQskB is about 180 ps. The PLL in the registered buffer R ensures that the edges of the output clock signal Yn remain almost fixed. However, the edges of the output data signal Qn are delayed with respect to the buffer output due to the propagation delay TPD (CK→Qn), which has increased due to the change to worst case supply voltage Vdd and temperature conditions.

The third scenario and the fourth scenario show the opposite situation. In both scenarios the registered buffer is trained at minimum allowed supply voltage Vdd and maximum allowed environment temperature. In the third scenario, the TQsk measurement is performed under equal training and operating conditions. In the fourth scenario, training and operating conditions are opposite corners. During operation, the supply voltage Vdd and the temperature is changed in the opposite direction as in the second scenario. Now, the data signals Qn have smaller delay and the TQsk bar is shifted to lower (more negative) time values. Since the TQsk values depend on the supply voltage and temperature conditions during normal operation and during phase aligning training, a wide TQsk performance window is received. The entire TQsk performance window consists of one time DeltaTQskA and two times DeltaTQskB. DeltaTQskA represents the TQsk contribution from the pin to pin skew of Qn, the matching between the data reference path and the data paths, the phase comparator accuracy and the device part to part variation. DeltaTQskB represents the TQsk contribution mainly from TPD (CK→Qn) changes due to supply voltage Vdd and temperature variations. A small part of DeltaTQskB shift is due to the drift of the edges of the output clock signal Yn over supply voltage and temperature. However, this output clock drift is very small due to the PLL.

$$TQsk\ window = Delta\ TQskA + 2 \times Delta\ TQskB \quad (1)$$

A major disadvantage of this TQsk window is its huge size and its center at 0 ps. In a preferred embodiment of the invention, the phase aligner training is performed only once in the automatic test equipment (ATE) under specific conditions (i.e., supply voltage, temperature, etc.) for each individual application frequency. Furthermore, the resulting phase aligning control word (PACW) is permanently stored in a non-volatile memory for each individual input clock frequency. The phase aligning training is performed only once on the ATE at supply voltage and temperature conditions which are between the corners of the supply voltage and the temperature. If, for example, the supply voltage and the temperature is chosen exactly between the two worst case corners (i.e. in the middle) the TQsk performance window can be reduced by one time Delta TQsk B. The resulting TQsk performance window may then consist of one time DeltaTQskA and one time Delta TQsk B:

$$TQskwindow = DeltaTQskA + 1 \times DeltaTQskB \quad (2)$$

Figure 6:
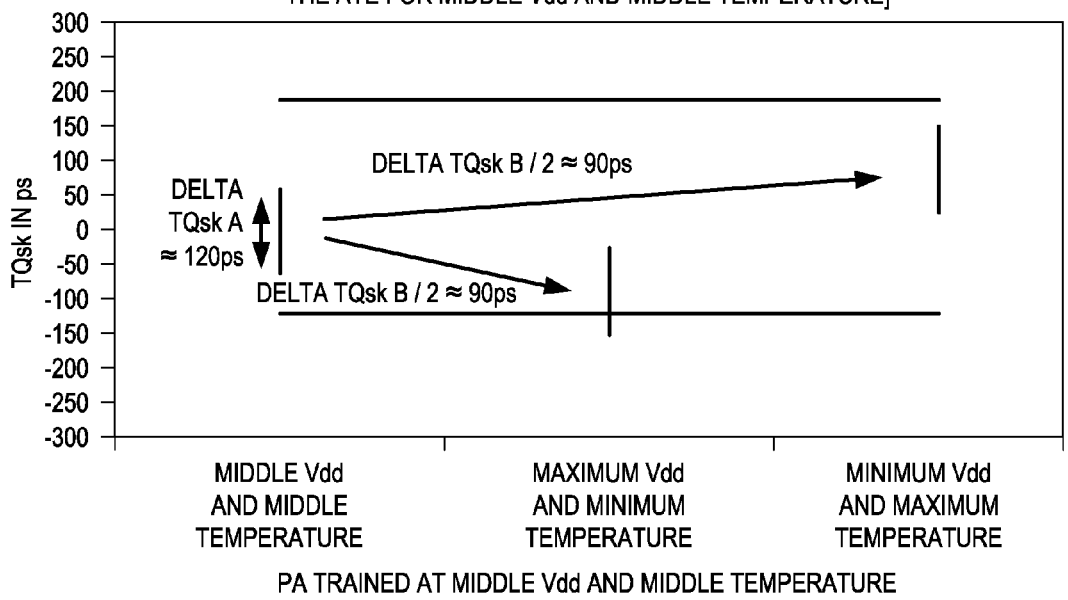
FIG. 6 shows timing parameter variation with respect to training and operating condition corners in accordance with a preferred embodiment of the present invention.

Turning to FIG. 6, it shows TQsk timing parameter variations and ranges in accordance with a preferred embodiment of the present invention. The phase aligning training is performed only once at the middle of the maximum allowable supply voltage range and at the middle of the temperature range (mid. Vdd and mid. Temp.). The TQsk shift towards both worst case corners (max Vdd and min Temp and min Vdd and max Temp) is only TQskB/2.

Figure 7:
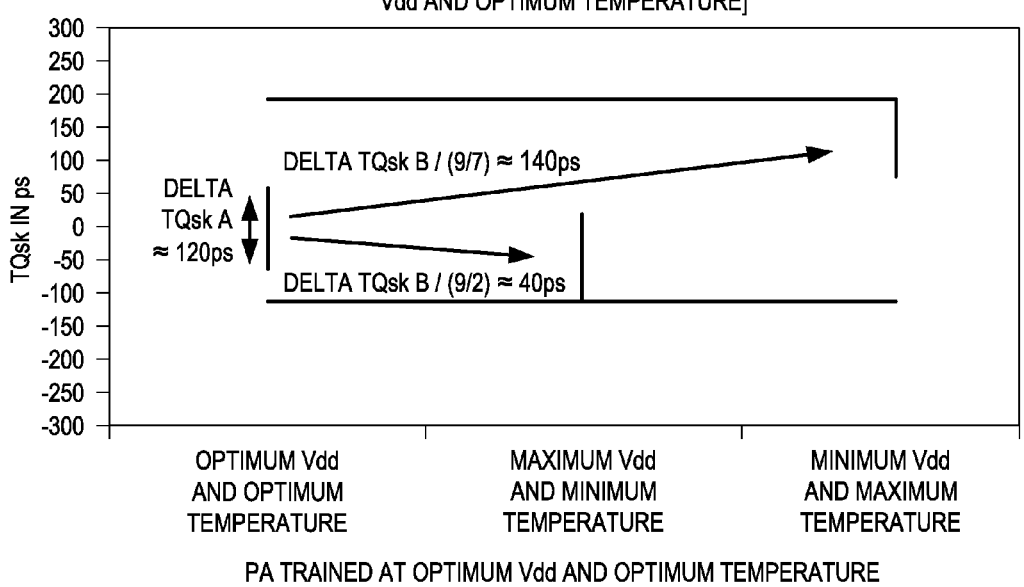
FIG. 7 shows timing parameter variations with respect to operating condition corners in accordance with a preferred embodiment of the present invention.

Tuning now to FIG. 7, the phase aligning training in the automatic test equipment is performed under conditions which are selected such that the resulting TQsk window is shifted in accordance with an asymmetric TQsk specification limit window. The supply voltage and the temperature conditions are shifted from the middle (mid. Vdd and mid. Temp.) towards one of the allowed worst case supply voltage Vdd or temperature conditions. Selecting an optimum voltage supply Vdd and temperature for the phase aligning training during the final manufacturing step, the resulting TQsk performance window can be fitted into the desired TQsk specification limit window. The optimum training conditions depend on the maximum and minimum limits for the timing parameter TQsk and are to be determined on a case-by-case basis. The TQsk window size is similar to the one of the scenario shown in FIG. 6 and indicated in equation (2). The difference is that the TQsk window is not symmetrically centered around 0 ps. The amount of window shift is determined by how the voltage supply and temperature condition is chosen compared to the two allowed worst case supply voltage and temperature corners.

The normal TQsk window size ranges from −240 ps to +240 ps resulting in an overall window size of 480 ps. A new registered buffer 200 has a TQsk performance window of −100 ps to +200 ps corresponding to an overall window size of 300 ps. This TQsk window size reduction and shifting provides an improved output data eye opening and centering for a large range of applications having a large number of different operating frequencies.

Figure 8:
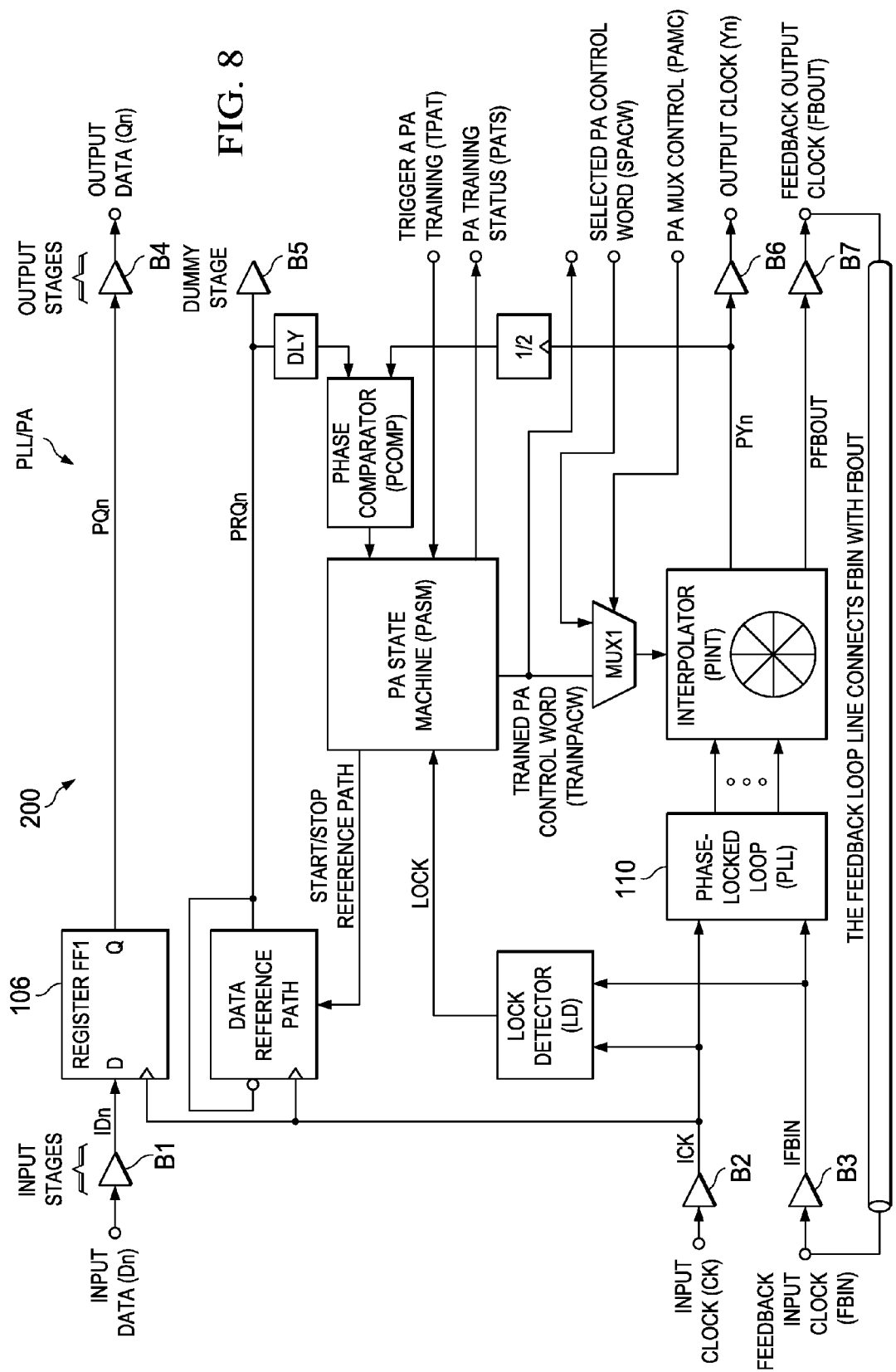
FIG. 8 shows a simplified block diagram of a registered buffer in accordance with a preferred embodiment of the present invention.
Figure 9:
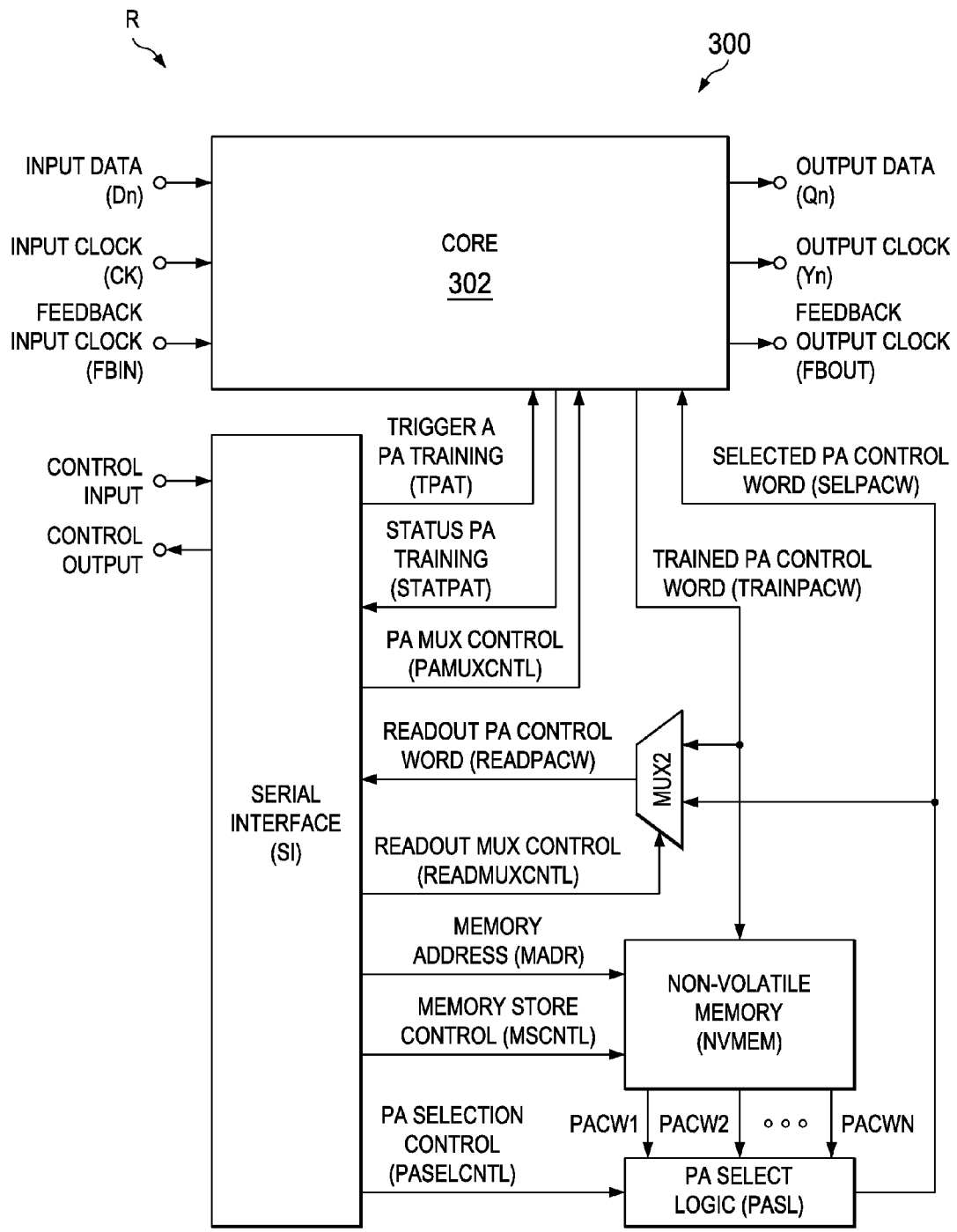
FIG. 9 shows a state diagram illustrating aspects of the method in accordance with a preferred embodiment of the present invention.

FIGS. 8 and 9 shows simplified blocks diagram the PLL/PA stage 200 of the core 302 (shown in FIG. 9) and registered buffer 300. The registered buffer 300 is similar to the registered buffer 106, but there are some differences. An important difference is that a selected phase aligning control word SPACW can be fed to the phase interpolator PINT through multiplexer MUX1. Multiplexer MUX1 is controlled through multiplexer control signal PAMC. The training of the apparatus R is performed in a final manufacturing stage in an automatic test equipment (ATE). The trained phase alignment control word TRAINPACW is not only passed to phase interpolator PINT but also outside to an additional control stage, which is shown in FIG. 9 in more detail. The stored phase alignment control words (PACW1 to PACWN in FIG. 9) can then be retrieved during normal operation from a non-volatile memory (NVMEM in FIG. 9).

The data eye opening of the apparatus is improved without impairing the propagation delay of the data or the system latency and the data eye opening can flexibly be shifted around a clock edge. Furthermore, the timing parameter can be individually stored for each apparatus and fits the requirements of the specific apparatus (type and within a production lot) and the application. Each may then be individually trained and preconfigured in the ATE.

In FIG. 9, a simplified block diagram of registered buffer 300 is shown. The core 302 is implemented as shown in FIG. 8. The logic part of the registered buffer R includes a non-volatile memory NVMEM, a phase aligning select logic PASL, numerous different control words and control signals. The serial interface SI serves to select different device modes, as for example logic functions and output driver strength. Here, the serial interface SI is also used to control the phase aligning training procedure, the storage of the trained phase aligning control words PACW1 to PACWN, and the selection of the desired phase aligning control words form the non-volatile memory NVMEM. The phase aligning (PA) training is performed once in the ATE register 300 individually under precise predefined supply voltage and temperature conditions (training conditions). As needed for the support different input clock frequencies FCK, the phase aligning training is performed for each input clock frequency FCK individually. This is due to the fact that the phase aligning control word defines a phase shift with respect to the clock period of the input clock CK. As the phase shift is always related to the clock frequency FCK, it is advantageous to store an individual phase aligning control word (PACW1 to PACWN) for each operating clock frequency. The registered buffer 300 may be used in a well defined DDR3 memory system and may support six speed nodes (system clock frequencies) for 1.5 V Vdd supply voltage range and five speed nodes (system clock frequencies) for 1.35 V Vdd supply voltage range. The memory controller (such as memory controller 102) coupled to the registered buffer 300 indicates a specific speed node and supply voltage Vdd range by writing speed bits and Vdd range selection bits into the serial interface SI of the registered buffer R (through control input of serial interface SI). These control bits are used to select the desired phase aligning control words PACW from the non-volatile memory NVMEM.

A phase aligning training can be triggered through signal TPAT. The status of the phase alignment training is transmitted through signal STATPAT. Multiplexer MUX1 shown in FIG. 8 is controlled through mux control signal PAMUX-CNTL. A multiplexer MUX2 is coupled to receive selected phase alignment control words SELPACW (PACW1 to PACWN from memory NVMEM) from non-volatile memory NVMEM. MUX2 is controlled with readout MUX control signal READMUXCNTL. The selected phase alignment control word SELPACW read out through MUX2 as signal READPACW and passed to serial interface SI. It may then be externally processed. A memory address MADR and a memory control signal MSCNTL are used to write trained control words TRAINPACW (from stage PLL/PA 300) to and read control words PACW1 to PACWN from memory NVMEM. Phase alignment selection control signal PASELCNTL is used to control phase alignment select logic PASL which retrieves phase alignment control words PACW1 to PACWN from memory NVMEM and passes the selected control words to stage PLL/PA 200.

Figure 10:
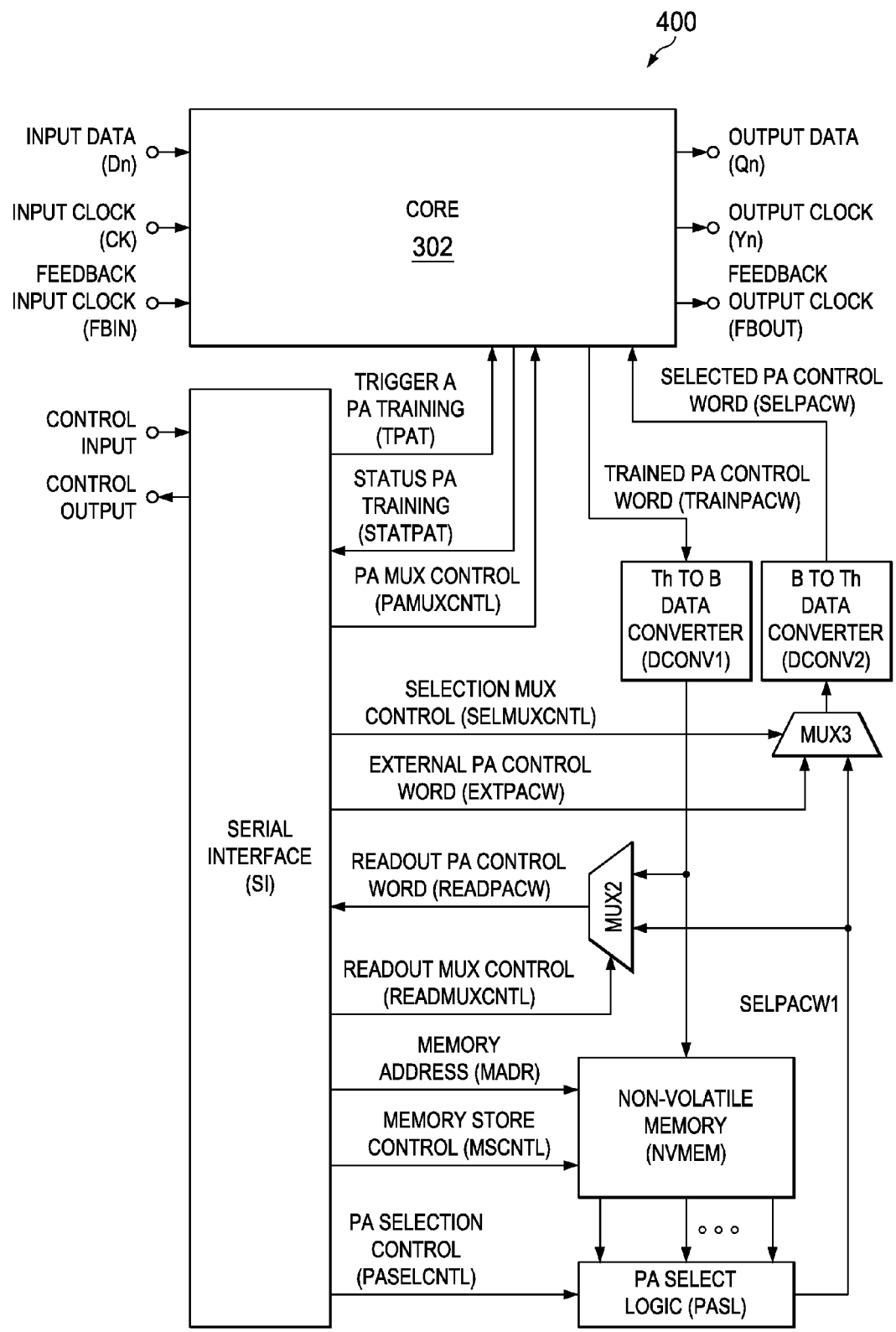
FIG. 10 shows a simplified block diagram of a part of a registered buffer in accordance with a preferred embodiment of the present invention.

In FIG. 10, an example of simplified block diagram of registered buffer 400 is shown. Compared with registered buffer 300 of FIG. 9, there is an additional multiplexer MUX3, respective multiplexer control signals SELMUXCNTL, and a path for external phase alignment control words EXTPACW coupled to multiplexer MUX3 and data converters DONV1 and DCONV2. Multiplexer MUX3 is controlled with selection multiplexer control signal SELMUXCNTL and either selects the phase aligning control word SELPACW1 (selected by phase alignment select logic PASL from non-volatile memory NVMEM) or an external phase aligning control word EXTPACW. Accordingly, it is possible to apply an external phase alignment control word EXTPACW through the serial interface SI to the phase interpolator PINT in stage PLL/PA (which is generally part of core 302). With an external phase alignment control word it is possible to test or to debug the registered buffer 400. Furthermore, there are two data converters DCONV1 and DCONV2 coupled into the trained phase alignment control word path and the selected phase alignment control word path. These data converters DCONV1 and DCONV2 code and decode the phase aligning control word PACW between thermometer code and binary code. This control coding and decoding reduces the amount of needed memory bits by reducing the number of bits of the phase aligning control words PACW1 to PACWN. In the PLL/PA stage (such as stage 200), the trained phase alignment control word TRAINPACW is coded in a thermometer code which requires a large number of bits compared to the same phase aligning control word coded in binary code. However, for the state machine PASM and the phase interpolator PINT thermometer code is more efficient and easier to implement. Therefore, DCONV1 converts from thermometer code to binary code and DCONV2 converts SELPACW1 from binary code to thermometer code.

Figure 11:
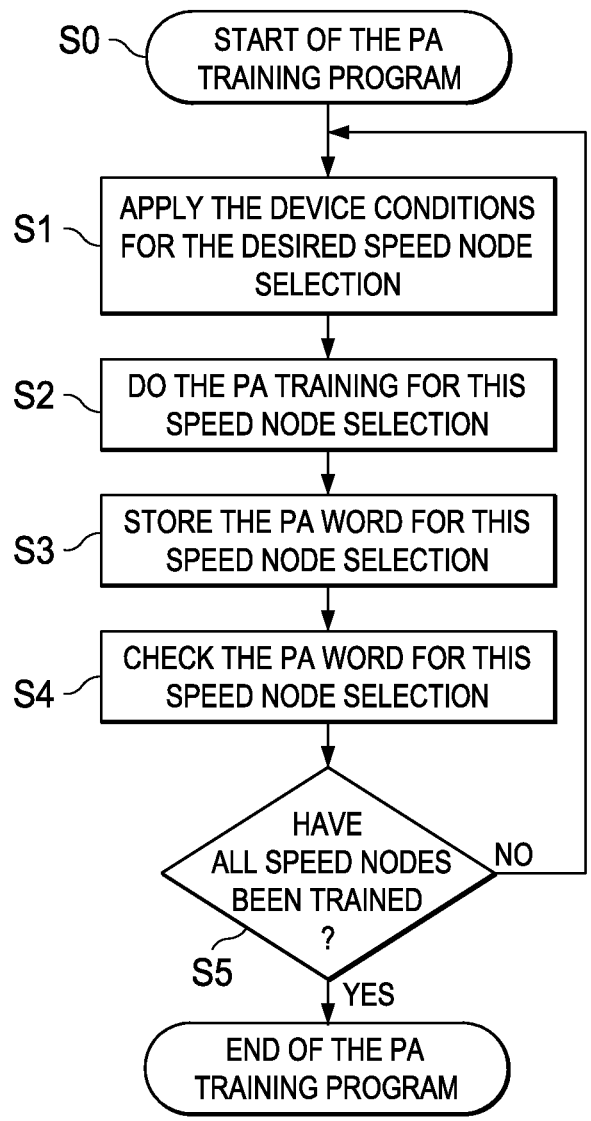
FIG. 11 shows a simplified block diagram of a part of a registered buffer in accordance with a preferred embodiment of the present invention.

FIG. 11 shows a state diagram of a phase aligning training session in accordance with a preferred embodiment of the present invention. This training session is advantageously performed in an ATE during a final manufacturing step. The training session generally comprises the following steps: In step S1, the desired supply voltage Vdd and temperature training conditions are applied to the device on the ATE. Further, the registered buffer 300 or 400 is powered up with the desired input clock frequency. The phase aligning multiplexer control bit PAMC is set so as to feed the phase aligning control word PACW from the phase aligning state machine PASM to the phase interpolator PINT. The phase aligning training procedure is triggered by setting the "trigger a phase alignment training training" control bit (TPAT) in the serial interface SI. For the phase aligning training procedure, the "PA Mux control" bit PAMUXCNTL is also set. After the PLL and phase aligning stabilization and training time period, the "status phase alignment training" control bit STATPAT is read out via the serial interface SI in order to check whether or not the phase aligning training is completed. If the phase aligning training is completed, the training logic proceeds from step S2 and to step S3. The resulting phase aligning control word PACW (TRAINPACW) is read out via the serial interface SI. This is performed by setting the "read out Mux control" bit READMUXCNTL. The desired memory address MADR is fed to the non-volatile memory NVMEM and the "memory store control" bit MSCNTL triggers writing of the phase aligning control word PACW (TRAINPACW) in the non-volatile memory NVMEM. Successful storage of the phase aligning control word PACW (TRAINPACW) is verified by reading out the memory content via the phase aligning select logic PASL and comparing this phase aligning control word SELPACW (or SELPACW1 in FIG. 10) with the read out phase aligning control word READPACW which has been read out before the storage. In order to read out the stored phase aligning control word PACW1 to PACWN, the "phase alignment selection control" bit PASELCNTL and the "read out Mux control" bit READMUXCNTL are to be set. All this is performed in step S4. If the storage and control of the phase aligning control word PACW (TRAINPACW) is successful, the entire procedure is repeated for the next input clock application frequency (speed node). During the next iteration, not only the input clock frequency (speed node) needs to be changed, but also the memory address MADR and the "phase alignment selection control" bit PASELCNTL. If all speed nodes have been considered during the training procedure, the apparatus decides in step S5 to finish the program. After the completion of the entire phase aligning training procedure for the registered buffer 300 or 400 on the automatic test equipment for all speed nodes and supply voltage application ranges, all required phase aligning control words PACW1 to PACWN for the different application scenarios are permanently stored in the non-volatile memory NVMEM.

With a registered buffer 300 or 400 with a non-volatile memory containing the phase alignment control words, no further phase aligning control word training during initialization (power up) is generally required, if it is used in an application. The memory controller coupled to the registered buffer 300 or 400 simply flags the desired application frequency (speed node) through the serial interface SI and to the phase aligning selection logic PASL. The correct phase aligning control world PACW1 to PACWN is retrieved from the non-volatile memory NVMEM and applied to the phase interpolator PINT of stage PLL/PA as shown in FIG. 6.

Another operating and/or training condition that may be optimized similar to the supply voltage level, temperature conditions, and their corners. The loads may be different for each pin or they may vary from application to application or they may be optimized for various applications and configurations.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus for buffering a data signal between a memory controller and a DRAM, the apparatus comprising:
    a phase locked loop (PLL);
    a phase interpolator for aligning a phase of an output clock signal in response to a phase aligning control word; and
    a non-volatile storage location that stores the phase aligning control word, wherein the phase aligning control word is determined through an initial training procedure of the apparatus using predetermined training conditions,
    wherein the predetermined training condition include at least a predetermined supply voltage level and a predetermined temperature, and wherein the predetermined training conditions are set so as to generally optimize the phase alignment of an edge of the output clock signal with respect to a buffered data signal, wherein the predetermined training conditions during the initial training are set apart from the middle of at least two corners of the training conditions so as to comply with an asymmetric behavior of the phase with respect to the training conditions, wherein the buffered signal is derived from information derived from these training conditions, wherein the corners are a maximum supply voltage with a minimum temperature and a minimum supply voltage with maximum temperature.

2. The apparatus according to claim 1, wherein a plurality of non-volatile storage locations is provided for storing a plurality of phase aligning control words for different operating clock frequencies and/or supply voltage levels.

3. A method of buffering data between a memory controller and a DRAM and aligning a phase of an output clock signal with respect to the data, the method comprising:

setting predetermined training conditions of at least a supply voltage and a temperature;

performing a training procedure;

determining a phase aligning control word indicating the optimized phase alignment of the output clock signal under the predetermined training conditions;

storing the phase aligning control word in a non volatile memory in the apparatus; and running the apparatus with the stored phase aligning control word under normal operating conditions, wherein the method further comprises setting the predetermined training conditions apart from the middle of corners, wherein the buffered signal is derived from information derived from these training conditions, wherein the corners are a maximum supply voltage with a minimum temperature and a minimum supply voltage with a maximum temperature.

4. The method according to claim 3, wherein the method further comprises storing a plurality of phase aligning control words for different operating clock frequencies and/or supply voltage levels of the apparatus.

* * * * *